United States Patent [19]
Kitteridge

[11] Patent Number: 6,063,554
[45] Date of Patent: May 16, 2000

[54] PROCESSING OF LITHOGRAPHIC PRINTING PLATE PRECURSORS

[75] Inventor: John Michael Kitteridge, Leeds, United Kingdom

[73] Assignee: Agfa-Gevaert, N.V., Mortsel, Belgium

[21] Appl. No.: 09/182,664

[22] Filed: Oct. 30, 1998

[51] Int. Cl.⁷ ............................................. G03F 7/26
[52] U.S. Cl. .............................. 430/432; 134/15; 134/34
[58] Field of Search ............................... 430/432; 134/15, 134/34

[56] References Cited

U.S. PATENT DOCUMENTS 4,268,613  5/1981  Okishi ........................................ 430/197
5,695,908  12/1997  Furukawa ................................... 430/205

*Primary Examiner*—Hoa Van Le
*Attorney, Agent, or Firm*—Breiner & Breiner

[57] ABSTRACT

A wash liquor for use in the decoating of a silver halide diffusion transfer printing plate comprises an aqueous solution containing at least one non-ionic surfactant, such as an alcohol ethoxylate, an alkylphenol ethoxylate or an alkylamine ethoxylate. The liquor preferably also contains at least one organic or inorganic acid salt, and at least one of an enzyme, a biocide and an anti-foam. A process for the decoating of the said printing plate is also disclosed.

16 Claims, No Drawings

PROCESSING OF LITHOGRAPHIC PRINTING PLATE PRECURSORS

This invention relates to the processing of lithographic printing plate precursors and is principally concerned with the wash water used in the production of a lithographic printing plate by means of the system known as silver diffusion transfer.

The well-known comparatively high sensitivity to light of silver halides over conventional photopolymeric materials and their ability to respond to light from ultra-violet and infra-red make them ideally suited for use in printing plate applications where direct-to-plate exposure, rather than exposure through a contact film intermediate, is required.

Silver halides in this context can be used in a variety of ways. Printing plates, in general, include at least one layer of photosensitive material; such a layer may comprise a silver halide in combination with gelatin or other matrix binder, so providing a tough, ink-receptive image. This technique is often referred to as tanning development. Alternatively, a silver halide emulsion layer can be overcoated onto a conventional photopolymerisable layer of a printing plate. The consequence of the difference in sensitivity between the layers is that, at a given intensity of radiation, a short light exposure can be used to imagewise expose the top silver halide layer which, on development, forms a mask for a longer, blanket light exposure to convert the polymeric layer into a soluble or insoluble form depending on the nature of the photopolymer.

A third general use of silver halide in printing plate applications is the well known technique of diffusion transfer reversal (DTR). The principles of the DTR process have been described in U.S. Pat. No. 2,352,014 and in "Photographic Silver Halide Diffusion Processes" by Andre Rott and Edith Weyde, The Focal Press, London and New York, 1972. In this method, a developer is used which chemically develops exposed areas of the photosensitive coating whilst at the same time dissolving the unexposed areas. The developer contains a so-called silver halide solvent, such as sodium thiosulphate or sodium thiocyanate, and the complexes formed by these solvents with the dissolved silver halide from the unexposed areas diffuse to an image-receiving element, typically a nucleation layer containing physical development nuclei, and are reduced therein with a developing agent to form a silver image (DTR image) having reversed image density values with respect to the black silver image obtained in the exposed areas of the photographic material. An assembly including a DTR image may be used as a planographic printing plate, the silver image areas being the water-repellent, ink-receptive areas on an otherwise water-receptive, ink repellent background. The oleophilicity of the silver image areas may be improved by treatment with a suitable oleophilising agent, such as a mercapto compound.

Two different diffusion transfer systems are known. The two sheet system includes a silver halide layer and a receiving layer which are on separate substrates, and the system relies on the diffusion of silver halide from the former layer to the latter when the two are placed in contact in the presence of a developer. In the single sheet system, however, the silver halide layer and the receiving layer are both coated on the same substrate, and a water permeable relationship exists between the layers, allowing for image formation on application of a developer, following exposure. It is the latter, single sheet, system which is preferred for the preparation of offset lithographic printing plates via the diffusion transfer method.

There are two different types of single sheet diffusion transfer printing plates currently provided by the known art. In the first instance, plates are disclosed in, for example, U.S. Pat. No 4,722,535 and GBA-1241661, wherein a support is coated, in order, with a silver halide emulsion layer and an image receiving layer containing physical development nuclei. Following imagewise exposure and development, the plate is used for printing without removal of the spent emulsion layer. A second type of plate, however, includes the coatings applied in a different order, such that a support is coated first with a layer of physical development nuclei, then subsequently with a silver halide emulsion layer. The assembly is imagewise exposed and developed, then washed with water or an aqueous wash-off solution to remove the spent emulsion layer, thereby leaving a support carrying a silver image which may be used as a printing plate. Plates of this type are disclosed, for example, in EP-B-278766 and EP-A-410500.

During exposure of a two sheet diffusion transfer plate, all the silver halide in the exposed areas is converted to silver, which is dispersed throughout a binder material, this generally comprising gelatin. Water has been most commonly used as the wash-off solution for removal, or decoating, of the spent emulsion layer.

Ecological, economic and general practical considerations dictate that re-use of the wash-off solution to the maximum extent possible is particularly desirable, and silver is most preferably removed from this recirculated wash water by means of a filtration system, such as that described in EP-A-651063. This document also discloses flocculation of the silver via the addition of materials such as cationic surfactants—for example, Empigen BCB50 from Albright and Wilson—or cationic polymers—for example, Merquat 100 supplied by Chemviron—thereby facilitating the more efficient removal of the silver by filtration.

Nevertheless, it has still been found that there are difficulties associated with this method. Most particularly, the use of such materials tends to lead to stickiness of the flocculated silver which, in turn, can result in problems due to the accumulation of this flocculated silver on the walls of the wash tank and in the pipe work, and may even cause seizure of pumps to occur. Furthermore, redeposition of the flocculated silver on the processed plates is an additional hazard, creating the potential for the appearance of black marks on the plate surfaces and, consequently, on the printed images.

It is, therefore, an object of the present invention to provide a wash liquor, the use of which does not lead to such stickiness of the flocculated silver halide and, thereby, to provide a means of achieving cleaner plate processing.

It has now been found that very significant improvements can be effected in this regard by the addition of non-ionic surfactants to the wash water. Moreover, in reducing or eliminating stickiness of the flocculated silver and facilitating cleaner processing in this way, no deleterious effect is provided in terms of actual flocculation of the silver, or its subsequent removal from the wash water by filtration.

According to the present invention, there is provided a wash liquor for use in the decoating of a silver halide diffusion transfer printing plate, said wash liquor comprising an aqueous solution containing at least one non-ionic surfactant.

Various types of non-ionic surfactant are available, and all are effective, at least to some extent, in reducing the stickiness of the flocculated silver. The types of non-ionic surfactant are detailed in "Surfactants Europa—A Directory of Surface Active Agents available in Europe", published by The Royal Society of Chemistry.

In practice, the wash water in such systems tends to be alkaline due to the carry over of developer from the plate development stage. Consequently, it is desirable that the non-ionic surfactant should be stable in alkaline conditions. Additionally, surfactants which generate low levels of foam are preferred.

Typical low foam non-ionic surfactants which are alkali-stable include ethylene oxide/propylene oxide block copolymer type surfactants; unfortunately, however, such products are less effective than other non-ionic surfactants in preventing stickiness of the flocculated silver. Improved results in this regard are shown by alcohol ethoxylates, alkylphenol ethoxylates and alkylamine ethoxylates, all of which are alkali stable materials and are particularly effective in the wash liquors of the present invention. Especially preferred surfactants are the low foam modified alcohol ethoxylates such as Ethylan CPG660 and Ethylan CPG945 (Akcros Chemicals).

The non-ionic surfactant may be added to the wash water either as a separate aqueous solution, or in combination with the silver flocculating agent, such as a cationic surfactant or cationic polymer. Either a single non-ionic surfactant or mixtures of said surfactants may be employed. The surfactant is preferably present in the wash water to the extent of from 0.01 to 50 g/l, more preferably from 0.1 to 10 g/l. The temperature of the wash water is generally controlled in the range between 20° C. and 50° C., although it preferably falls between 30° C. and 40° C.

Optionally, the wash water may also contain additional additives including, for example, enzymes, biocides and anti-foams, all of which may be added to the liquor in combination with the non-ionic surfactant. Preferably, the wash liquor will also contain at least one organic or inorganic acid salt, such as a silicate or pyrophosphate—as disclosed in our co-pending Application No. GB 9723026.2—which is added in combination with the non-ionic surfactant and serves to provide improved plate decoating properties. Most preferably, the wash water further includes an enzyme which is capable of degrading gelatin, for example trypsin, pepsin, papain or a bacterial proteinase, such as Alcalase®2.5L (supplied by Novo Enzymes Limited).

The decoating process is most successfully carried out by treating the plate with the wash liquor whilst, at the same time, applying mechanical forces. Thus, the use of high pressure jets or scrubbing rollers produces the most satisfactory results.

The printing plate used in conjunction with the wash liquor of the present invention is, most preferably, a single sheet diffusion transfer printing plate comprising a substrate, an image receiving layer and a silver halide emulsion layer.

The substrate used is generally aluminium, which may be pure aluminium or, alternatively, may comprise an aluminium alloy having an aluminium content of at least 95%. The thickness of the substrate preferably lies in the range between 0.13 mm and 0.5 mm. In order to enhance its lithographic properties, the aluminium is electrochemically grained and anodised on at least one surface. Graining of the substrate may be achieved by treating the surface with an aqueous acid or a mixture of acids; typically, hydrochloric acid, or a mixture of hydrochloric and nitric acids may be employed. Anodising is preferably carried out by treating the grained aluminium substrate in an aqueous mineral acid or a mixture of such acids. Most satisfactory results are obtained by the use of sulphuric or phosphoric acids or their mixtures. Typical graining and anodising conditions are disclosed in U.S. Pat. No. 3,861,917. Most preferably, the graining and anodising conditions are selected such that the substrate has an anodic weight ($g/m^2$) to surface roughness (microns) ratio greater than 6, more particularly greater than 8, according to the disclosures of EP-B-278766.

Optionally, the grained and anodised aluminium may be laminated to other materials, such as paper or various plastics materials, in order to enhance its flexibility whilst retaining the good dimensional stability associated with aluminium.

The image receiving layer preferably comprises a metal sol, most preferably colloidal silver nuclei prepared by the Carey Lea method at a coating weight in the region of 3 $mg/m^2$. The colloidal nuclei are optionally dispersed in a suitable binder, most preferably gelatin. Alternative colloidal nuclei which may be employed include sulphides of heavy metals, such as silver sulphide or palladium sulphide.

The silver halide emulsion layer may be any photosensitive silver halide emulsion incorporating a hydrophilic colloid binder. The photosensitive silver halide may comprise, for example, silver chloride, silver bromide, silver bromoiodide or silver chlorobromide or their mixtures. The use of an emulsion containing in excess of 50% silver chloride is preferred in order that a sufficiently high rate of dissolution of the silver halide may be achieved during development, and that satisfactory gradation may be obtained for lithographic purposes. It is also desirable that the emulsion should include a minimum of 20% silver bromide, thereby ensuring adequate stability on the grained, anodised aluminium substrate.

The silver halide emulsion may include coarse or fine grains, and can be prepared by any of the standard procedures well known to those skilled in the art. Optionally, the emulsion may be chemically and spectrally sensitised. The available techniques for the preparation and coating of the emulsion are detailed in Product Licensing Index, Volume 92, December 1971, publication 9232.

In addition to the preferred negative working silver halide emulsions, which exhibit particularly high photosensitivity, direct positive silver halide emulsions, producing a positive silver image in the emulsion layer and a negative silver image on the aluminium substrate, may also be employed.

The emulsion layer also includes a hydrophilic colloid binder, as previously disclosed. Generally, the binder comprises a protein, preferably gelatin. However, partial replacement of the gelatin with suitable synthetic, semi-synthetic or natural polymers is possible.

Optionally, the emulsion may also include further components such as antifogging agents, development agents, development accelerators, wetting agents, stabilisers, acutance dyes and pigments, matting agents and the like.

Additionally, it is possible to include a further, intermediate, water-swellable layer between the image receiving layer and the silver halide emulsion layer. Suitable intermediate layer formulations are detailed in EP-A-483415.

The diffusion transfer plate containing the above elements is imagewise exposed to a beam of energy, and the exposed plate is developed by treatment with an aqueous alkaline solution in the presence of at least one developing agent and at least one silver halide solvent. The developing agent or agents and the silver halide solvent or solvents may be incorporated in the aqueous alkaline solution and/or in the actual imaging element itself.

The most suitable developing agents for use in conjunction with the present invention are hydroquinone-type compounds in combination with secondary developing agents.

Preferably, the hydroquinone-type compound is hydroquinone itself, methyl hydroquinone or chlorohydroquinone.

The secondary developing agent comprises p-N-methylaminophenol, 1-phenyl-3-pyrazolidone, or a derivative of the latter, such as 4-methyl-1-phenyl-3-pyrazolidone, 4,4-dimethyl-1-phenyl-3-pyrazolidone, 4-hydroxymethyl-4-methyl-1-phenyl-3-pyrazolidone or 4-methyl-1-tolyl-3-pyrazolidone.

Typical silver halide solvents for use in relation to the present invention include thiosulphates and thiocyanates which are able to form complexes with silver halides, for example ammonium thiosulphate, potassium thiosulphate or, most preferably, sodium thiosulphate pentahydrate, which is used at a level of 5 to 150 g/l, preferably 10 to 80 g/l. Alternative silver halide solvents are disclosed in the prior art; for example polythioethers are described in U.S. Pat. No. 5,200,294, EP-A-554585 mentions the use of meso-ionic compounds, whilst cyclic imides and thiosalicylates are the subjects of U.S. Pat. No. 4,297,430 and U.S. Pat. No. 2,857,276, respectively. Optionally, combinations of silver halide solvents may be employed, and it is possible to incorporate one or more silver halide solvents into a suitable layer of the plate, and also include one or more silver halide solvents in the developing solution.

The aqueous alkaline developing solution typically incorporates common alkaline materials such as sodium hydroxide, potassium hydroxide, sodium carbonate or alkali metal salts of phosphoric and/or silicic acid, e.g. trisodium phosphate and sodium metasilicate. The solution may also include other ingredients, examples being oxidation preservatives, eg sodium sulphite, bromide salts, calcium sequestering agents, anti-sludge agents, antifoggants and thickening agents.

Preferably, the alkaline developing solution also contains amines or alkanolamines which act as development accelerators and, in addition, function as silver halide solvents; typical examples include 2-amino-2-methyl-1-propanol, 2-amino-2-methyl-1,3-propanediol, 2-amino-2-ethyl-1,3-propanediol, tris(hydroxymethyl) aminomethane, 2-amino-2-ethyl-1-propanol, 1-amino-2-propanol, 2-methylaminoethanol, ethanolamine, diethanolamine, triethanolamine and N,N-diethylaminoethanol.

The development and diffusion transfer operations may be carried out by means of any of a number of standard techniques, for example, by dipping the material to be treated in to the liquid composition. Said treatment is generally carried out at a temperature in the range 15–30° C. and over a period of around 5–60 seconds. Any excess of alkaline developer remaining following the development process and formation of the silver image may be removed by passing the plate through a pair of squeezing rollers.

The surface of the silver image thereby produced in the layer of physical development nuclei may then be exposed by washing the plate with water, such that removal of all the layers above this layer takes place.

Improved printing performance may be achieved by chemical treatment of the imaged surface of the aluminium with a formulation which increases the hydrophilicity of the background areas and also enhances the oleophilicity of the silver image. Said formulation for after treatment of plates is generally referred to as a fixer or finisher and, in the present case, would typically comprise an enzyme and a hydrophobising (oleophilising) compound. Typical such compositions are disclosed in EP-B-131462.

After said finishing treatment, the plate is ready for use in printing operations and may be used on a printing press to produce high quality prints.

The invention will now be illustrated, without limitation, by reference to the following experiments:

EXPERIMENT 1

A silver chlorobromide emulsion in a gelatin binder having a silver to gelatin weight ratio of 1:1 was coated at a coat weight of 4.0 g/m$^2$ onto grained and anodised aluminium substrate which had been previously coated with a Carey Lea silver sol. The plate was exposed to white light, and then processed in an Autolith SLT70 automatic processor comprising a development section, a wash section and a finisher section.

Development was for 20 seconds at 21° C. in the following developer solution:

| | |
|---|---|
| Sodium carboxymethylcellulose | 10 g |
| Sodium sulphite | 100 g |
| Hydroquinone | 20 g |
| 1-phenyl-3-pyrazolidone | 6.0 g |
| Sodium hydroxide | 17 g |
| Sodium thiosulphate.5H$_2$O | 20 g |
| Na$_4$EDTA | 2.0 g |
| 2-Methylaminoethanol | 30 ml |
| Water to 1 litre | |

The wash section contained a scrubbing roller and 25 liters of fresh water at 32° C. A total of 15.6 m$^2$ of plate was processed. The wash water was collected. The silver content of the water was 1.0 g/l.

To 1 liter samples of the above wash water at 32° C. were added various non-ionic surfactants and 1.0 ml of the flocculent solution (example 4 of EP-A-651,063)

| | |
|---|---|
| Merguat 100 | 250 ml |
| Alcalase ® 2.5L | 25 ml |
| Glycerol | 450 ml |
| Bacteron B6 | 25 ml |
| Victoria Blue B | 0.5 g |
| Water | 250 ml |

(Merquat 100 is a solution of a cationic polymer supplied by Chemviron; Alcalase®2.5 L is an enzyme supplied by Novo Enzymes Limited; Bacteron B6 is a biocide supplied by Bactria Biocides.)

The mixture was stored for 5 minutes in the presence of a piece of clean polypropylene sheet. The mixture was then gently washed off with water and the amount of flocculated silver adhered to the polypropylene was noted. The results were graded from 0 to 5, a value of 5 indicating a significant amount of silver adhered to the polypropylene sheet and a value of 0 indicating perfectly clean polypropylene sheet.

| | Amount G | Surfactant | Type | Supplier | Dirt rating |
|---|---|---|---|---|---|
| a | — | None | — | — | 5 |
| b | 1.0 | Phospholan KPE4 | Anionic | Akcros | 5 |
| 1 | 1.0 | Supronic B25 | Block copolymer | Rhone-Poulenc | 5 |
| 2 | 1.0 | Pluronic PE6800 | Block copolymer | BASF | 2 |
| 3 | 2.0 | Pluronic PE6800 | Block copolymer | BASF | 2 |

-continued

| Amount G | Surfactant | Type | Supplier | Dirt rating |
|---|---|---|---|---|
| 4  2.0 | Pluronic PE6400 | Block copolymer | BASF | 2 |
| 5  1.0 | Triton X-102 | Octylphenol ethoxylate | Union Carbide | 0 |
| 6  0.5 | " | Octylphenol ethoxylate | " | 0 |
| 7  0.25 | " | Octylphenol ethoxylate | " | 0 |
| 8  0.1 | " | Octylphenol ethoxylate | " | 0 |
| 9  0.05 | " | Octylphenol ethoxylate | " | 1 |
| 10  1.0 | Triton X-100 | Octylphenol ethoxylate | " | 0 |
| 11  1.0 | Triton X-405 | Octylphenol ethoxylate | " | 1 |
| 12  1.0 | Ethomeen C25 | Alkylamine ethoxylate | Akzo Nobel | 0 |
| 13  1.0 | Ethylan CPG660 | Alcohol ethoxylate | Akcros | 0 |
| 14  1.0 | Ethylan CPG945 | Alcohol ethoxylate | Akcros | 0 |
| 15  1.0 | Brij 35 | Alcohol ethoxylate | ICI | 0 |
| 16  1.0 | Synperonic A50 | Alcohol ethoxylate | ICI | 0 |
| 17  1.0 | Tween 20 | Ester ethoxylate | ICI | 0 |
| 18  1.0 | Zonyl FSN | Non-ionic fluorosurfactant | DuPont | 0 |
| 19  0.1 | Surfynol 104E | Acetylenic | Air Products | 1 |
| 20  1.0 | Plurafac LF401 | Alcohol ethoxylate | BASF | 0 |
| 21  1.0 | Igepal CO99O | Nonylphenol ethoxylate | Rhone-Poulenc | 0 |

EXPERIMENT 2

A silver chlorobromide emulsion in a gelatin binder having a silver to gelatin weight ratio of 1:1 was coated at a coat weight of 4.0 g/m$^2$ onto grained and anodised aluminium substrate which had been previously coated with a Carey Lea silver sol. After imagewise exposure the plate was processed in an Autolith SLT70 automatic processor comprising a development section, a wash section, and a finisher section. Development was for 30 seconds at 20° C. in the developer described in experiment 1.

This gave chemically reduced silver in the exposed areas and physically reduced silver attached to the anodised aluminium in the non-exposed areas. After developing, the plate was transferred to a wash section comprising scrub rollers and water jets, and containing 25 liters of water at 32° C. This removed loose material, which comprised silver metal, gelatin, silver complexes and developer, from the plates. The flocculent mixture of experiment 1 was then added to the wash water at a rate of 1.6 ml/m$^2$ of plate. The wash water was pumped through a 5 micron, 50 cm Purtrex polypropylene filter (supplied by Osmonics Inc, Minnetonka, USA) and recycled. Substantially all of the silver was removed from the wash water. After 100 m$^2$ of plate had been processed the filter became blocked with silver. A sticky deposit of silver was present on the sides of the wash water tank.

The above procedure was repeated but this time the wash water contained 1.0 g/l Ethylan CPG660, added at the start. Silver was removed from the wash water as before but the sides of the wash water tank were now substantially free of any silver deposit.

I claim:

1. A process for the decoating of a silver halide diffusion transfer printing plate, said process including the step of treating the plate with a wash liquor comprising an aqueous solution containing at least one non-ionic surfactant.

2. A process as defined in claim 1 wherein said treatment is carried out at a temperature of from 20° to 50° C.

3. A process as defined in claim 2 wherein said temperature is from 30° to 40° C.

4. A process as defined in claim 1 wherein said treatment is carried out whilst simultaneously applying a mechanical force to said printing plate.

5. A process as defined in claim 4 wherein said mechanical force is applied by means of high pressure jets or scrubbing rollers.

6. A process as defined in claim 1 wherein said non-ionic surfactant is a low foam surfactant which is stable in alkaline conditions.

7. A process as defined in claim 1 wherein said non-ionic surfactant comprises an alcohol ethoxylate, an alkylphenol ethoxylate or an alkylamine ethoxylate.

8. A process as defined in claim 1 wherein said surfactant is present in an amount of from 0.01 to 50 g/l.

9. A process as defined in claim 8 wherein said surfactant is present in an amount of from 0.1 to 10 g/l.

10. A process as defined in claim 1 wherein said wash liquor further comprises a silver flocculating agent.

11. A process as defined in claim 10 wherein said flocculating agent comprises a cationic polymer or cationic surfactant.

12. A process as defined in claim 1 wherein said wash liquor further comprises at least one organic or inorganic acid salt.

13. A process as defined in claim 12 wherein said salt comprises a silicate or pyrophosphate salt.

14. A process as defined in claim 1 wherein said wash liquor further comprises at least one member selected from the group consisting of an enzyme, a biocide and an antifoam.

15. A process as defined in claim 14 wherein said member is an enzyme that is capable of degrading gelatin.

16. A process as defined in claim 15 wherein said enzyme comprises trypsin, pepsin, papain or a bacterial proteinase.

* * * * *

UNITED STATES PATENT AND TRADEMARK OFFICE
CERTIFICATE OF CORRECTION

PATENT NO.   : 6,063,554
DATED        : May 16, 2000
INVENTOR(S)  : John Michael Kitteridge Page 1 of 1

It is certified that error appears in the above-identified patent and that said Letters Patent is hereby corrected as shown below:

<u>Title page,</u>
Insert Item -- [30]   Foreign Application Priority Data
        Nov. 1, 1997   [GB]   Great Britain................9723025 --.

Signed and Sealed this

Sixteenth Day of May, 2006

JON W. DUDAS
*Director of the United States Patent and Trademark Office*